United States Patent
Maxim et al.

(10) Patent No.: US 11,342,889 B2
(45) Date of Patent: May 24, 2022

(54) POWER AMPLIFIER SYSTEM

(71) Applicant: Qorvo US, Inc., Greensboro, NC (US)

(72) Inventors: George Maxim, Saratoga, CA (US); Stephen James Franck, Felton, CA (US); Michael F. Zybura, Scotts Valley, CA (US); Baker Scott, San Jose, CA (US)

(73) Assignee: QORVO US, INC., Greensboro, NC (US)

( * ) Notice: Subject to any disclaimer, the term of this patent is extended or adjusted under 35 U.S.C. 154(b) by 0 days.

(21) Appl. No.: 16/983,432

(22) Filed: Aug. 3, 2020

(65) Prior Publication Data

US 2020/0366250 A1 Nov. 19, 2020

Related U.S. Application Data

(63) Continuation of application No. 16/282,861, filed on Feb. 22, 2019, now Pat. No. 10,734,953.

(51) Int. Cl.
| | | |
|---|---|---|
| *H03F 3/45* | (2006.01) | |
| *H03F 1/08* | (2006.01) | |
| *H03F 3/21* | (2006.01) | |
| *H03F 1/30* | (2006.01) | |

(52) U.S. Cl.
CPC ............. *H03F 1/083* (2013.01); *H03F 1/302* (2013.01); *H03F 3/21* (2013.01)

(58) Field of Classification Search
CPC ........................................................ H03F 3/45
USPC ........................................ 330/257, 261, 296
See application file for complete search history.

(56) References Cited

U.S. PATENT DOCUMENTS

| | | | |
|---|---|---|---|
| 6,091,302 A | 7/2000 | Arevalo | |
| 6,590,452 B1 | 7/2003 | van Rhijn | |
| 6,703,898 B2 | 3/2004 | Renous | |
| 6,717,467 B2 | 4/2004 | Renous et al. | |
| 7,248,653 B2 | 7/2007 | Wieck | |
| 7,365,604 B2* | 4/2008 | Luo .......................... | H03F 1/30 330/285 |
| 7,486,142 B2 | 2/2009 | Tsurumaki et al. | |
| 8,130,037 B2* | 3/2012 | Bowers ................... | H03F 1/302 330/261 |
| 9,797,271 B2 | 10/2017 | Brown | |
| 2006/0226910 A1* | 10/2006 | Tanoi ....................... | H03F 3/04 330/296 |

(Continued)

OTHER PUBLICATIONS

Notice of Allowance for U.S. Appl. No. 16/282,861, dated Mar. 31, 2020, 8 pages.

(Continued)

*Primary Examiner* — Henry Choe
(74) *Attorney, Agent, or Firm* — Withrow & Terranova, P.L.L.C.

(57) ABSTRACT

A power amplifier system is disclosed that includes a power amplifier having a first signal input, a first signal output, second signal input, and a second signal output. The power amplifier system further includes cross-coupled bias circuitry having a first transistor with a first collector coupled to the first signal input, a first base coupled to the second signal input, and a first emitter coupled to a fixed voltage node, a second transistor with a second collector coupled to the second signal input, a second base coupled to the first signal input, and a second emitter coupled to the fixed voltage node.

18 Claims, 7 Drawing Sheets

(56) References Cited

U.S. PATENT DOCUMENTS

| | | |
|---|---|---|
| 2007/0139115 A1 | 6/2007 | Forbes et al. |
| 2007/0273447 A1* | 11/2007 | Yamamoto ................ H03F 1/30 330/296 |
| 2007/0285172 A1* | 12/2007 | Manicone ............... H03F 3/193 330/296 |
| 2014/0152391 A1 | 6/2014 | Sowlati et al. |
| 2020/0274496 A1 | 8/2020 | Maxim et al. |
| 2020/0274499 A1 | 8/2020 | Maxim et al. |

OTHER PUBLICATIONS

Quayle Action for U.S. Appl. No. 16/282,853, dated Jun. 11, 2020, 6 pages.

\* cited by examiner

POWER AMPLIFIER SYSTEM

RELATED APPLICATIONS

This application is a continuation of U.S. patent application Ser. No. 16/282,861, filed Feb. 22, 2019, now U.S. Pat. No. 10,734,953, the disclosure of which is hereby incorporated herein by reference in its entirety.

This application is related to U.S. patent application Ser. No. 16/282,853, filed Feb. 22, 2019, now U.S. Pat. No. 10,903,800, titled POWER AMPLIFIER SYSTEM, the disclosure of which is hereby incorporated herein by reference in its entirety.

FIELD OF THE DISCLOSURE

The disclosure relates generally to power amplifier systems of radio frequency transmitters and in particular to power amplifier systems that provide bias signals for amplifiers over a wide range of input power levels.

BACKGROUND

A power amplifier is used to amplify radio frequency signals to be transmitted from an antenna of a wireless device such as a mobile telephone. A number of conventional power amplifiers employ bias circuitry that provides an inadequate bias signal level when the radio frequency signals reach a peak power level. As such, these conventional power amplifiers often suffer from output signal distortion at peak power levels. For example, the inadequate bias signal level results in amplitude modulation-amplitude modulation distortion that can cause an out-of-specification adjacent channel leakage ratio. Thus, a power amplifier system having a bias circuitry that provides adequate bias signal levels at all power levels is needed.

SUMMARY

A power amplifier system is disclosed that includes a power amplifier having a first signal input, a first signal output, second signal input, and a second signal output. The power amplifier system further includes cross-coupled bias circuitry having a first transistor with a first collector coupled to the first signal input, a first base coupled to the second signal input, and a first emitter coupled to a fixed voltage node, a second transistor with a second collector coupled to the second signal input, a second base coupled to the first signal input, and a second emitter coupled to the fixed voltage node.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
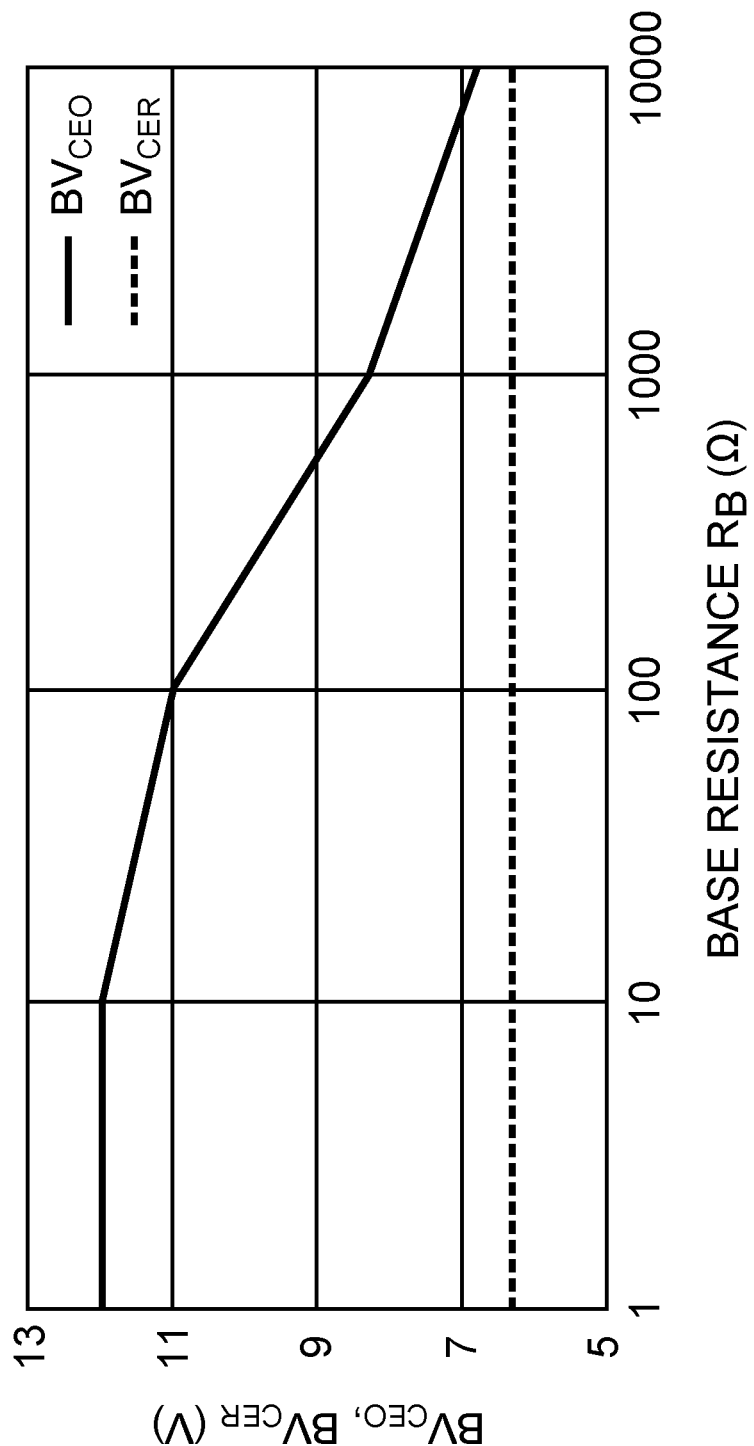
FIG. 1 is a graph of breakdown voltage variation with base resistance for a heterojunction bipolar transistor.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Ruggedness is a main limitation of silicon germanium (SiGe) power amplifiers. The SiGe process presents a more difficult trade-off between transition frequency (fT) and breakdown voltage when compared with gallium arsenide (GaAs) counterparts. As such, it is important to operate the device closer to breakdown voltage, collector-emitter, base short-circuited to emitter ($BV_{CES}$) rather than breakdown voltage, collector-emitter, base open ($BV_{CEO}$). However, traditional bipolar power amplifier bias networks use emitter followers to drive the bases of output stage devices. At the peak collector voltage the early avalanche current reduces the value of the base current and leads to cut-off of the driving emitter follower. This increase in impedance of the driving bias stage results in reduction of the device breakdown voltage to lower the breakdown voltage, collector-emitter, resistance between base and emitter ($BV_{CER}$), or even close to $BV_{CEO}$. This reduction in device breakdown voltage is depicted in FIG. 1, which is a graph of $BV_{CER}$ and $BV_{CEO}$ versus base resistance for a heterojunction bipolar transistor.

To address the aforementioned issues, this disclosure provides cross-coupled bias circuitry that lowers impedance of bases of a power amplifier output stage to avoid a cutoff of current from bias driving emitter followers of the main bias circuitry. In other words, the cross-coupled bias circuitry ensures lower driving impedance when collector voltages applied to devices making up the power amplifier are high. The lower driving impedance pushes device breakdown voltage higher, closer to $BV_{CES}$, and thus offers increased power amplifier ruggedness. In particular, the cross-coupled bias circuitry provides inverse replica cross-coupled dynamic currents that can be routed directly to the bases of the output stage or to the emitter followers. Fixed bias currents or pull-down resistors may be added to dynamic inverse replica components making up the cross-coupled bias circuitry.

Figure 2:
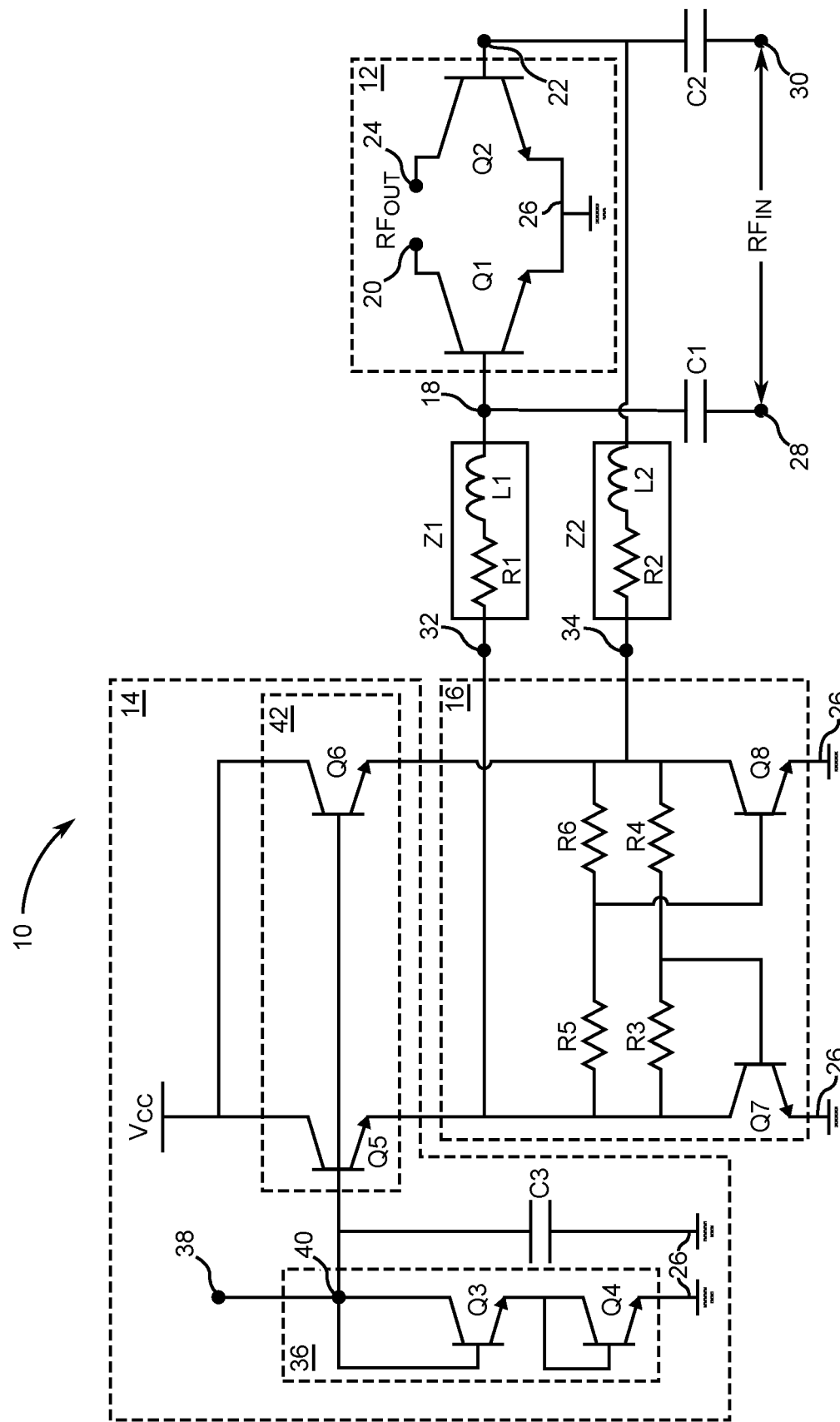
FIG. 2 is a schematic of an exemplary embodiment of a power amplifier system that includes a power amplifier, main bias circuitry, and cross-coupled bias circuitry configured in accordance with the present disclosure.

FIG. 2 is a schematic of an exemplary embodiment of a power amplifier system 10 that includes a power amplifier 12, main bias circuitry 14, and cross-coupled bias circuitry 16 that is configured to lower driving impedance and thereby push device breakdown voltage of the power amplifier higher. The main bias circuitry 14 and the cross-coupled bias circuitry 16 are configured to bias the power amplifier 12 for differential operation in accordance with the present disclosure.

In the exemplary embodiment of FIG. 2, the power amplifier 12 includes a first bipolar junction transistor (BJT) Q1 and a second BJT Q2. Moreover, the power amplifier 12 has a first signal input 18 that is a base terminal of the first BJT Q1 and a first signal output 20 that is a collector terminal of the first BJT Q1. The power amplifier 12 also has a second signal input 22 that is a base terminal of the second BJT Q2 and a second signal output 24 that is a collector terminal of the second BJT Q2. Emitters of both the first BJT Q1 and the second BJT Q2 are coupled to a common fixed voltage node 26 such as ground. In at least one embodiment, the first BJT Q1 and the second BJT Q2 are matching bipolar junction transistors.

A first capacitor C1 is coupled between the first signal input 18 and a first radio frequency (RF) input 28. A second capacitor C2 is coupled between the second signal input 22 and a second RF input 30. The first RF input 28 and the second RF input 30 make up a differential input $RF_{IN}$ and the first RF output 20 and the second RF output 24 make up a differential output $RF_{OUT}$.

In the exemplary embodiment of FIG. 2, a first impedance element Z1 is coupled between the first signal input 18 and a first bias output 32. In this example, the first bias output 32 is shared by the main bias circuitry 14 and the cross-coupled bias circuitry 16. A second impedance element Z2 is coupled between the second signal input 22 and a second bias output 34 that is also shared by the main bias circuitry 14 and the cross-coupled bias circuitry 16. In one embodiment, both the first impedance element Z1 and the second impedance element Z2 are predominately resistive. In another embodiment, both the first impedance element Z1 and the second impedance element Z2 are predominately inductive. Moreover, the first impedance element Z1 may include a first resistor R1 and/or a first inductor L1, and the second impedance element Z2 may include a second resistor R2 and/or a second inductor L2. The resistance and/or inductance values of the first impedance element Z1 and the second element Z2 are large enough to prevent an RF signal applied across the first RF input 28 and the second RF input 30 from modulating the main bias circuitry 14.

The main bias circuitry 14 includes a bias reference circuit 36 that has a reference supply input 38 that is coupled to a bias reference node 40. In this exemplary embodiment, the first bias reference circuit 36 is made up of a pair of stacked transistors Q3 and Q4 that are each in a diode configuration. A collector and a base of the transistor Q3 are coupled to the bias reference node 40, while a collector and a base of the transistor Q4 are coupled to an emitter of transistor Q3. An emitter of the transistor Q4 is coupled to the fixed voltage node 26, which in this case is ground. However, it is to be understood that a desired bias voltage and/or current can also be generated by replacing the pair of stacked transistors Q3 and Q4 with a single transistor, one or more diodes, or combinations thereof. One or more resistors can also be combined with the transistor(s) and/or diode(s) to more particularly refine the desired bias voltage and/or current at the bias reference node 40. Moreover, a third capacitor C3 coupled between the bias reference node 40 and the fixed voltage node 26 filters the desired bias voltage and/or current at the bias reference node 40.

The main bias circuitry 14 further includes a bias generator 42 that includes a fifth BJT Q5 that has a collector coupled to a power supply rail $V_{CC}$, a base coupled to the bias reference node 40, and an emitter coupled to the first bias output 32. Also included is a sixth BJT Q6 that has a collector coupled to the power supply rail $V_{CC}$, a base coupled to the bias reference node 40, and an emitter coupled to the second bias output 34.

In the exemplary embodiment of FIG. 2, the cross-coupled bias circuitry 16 includes a seventh BJT Q7 having a collector coupled to both the first bias output 32 and the emitter of the fifth BJT Q5. An emitter of the seventh BJT Q7 is coupled to the fixed voltage node 26. Moreover, a base of the seventh BJT Q7 is coupled to the first bias output 32 through a third resistor R3. The base of the seventh BJT Q7 is also coupled to the second bias output 34 through a fourth resistor R4.

Further still, the cross-coupled bias circuitry 16 also includes an eighth BJT Q8 having a collector coupled to both the second bias output 34 and the emitter of the sixth BJT Q6. An emitter of the eighth BJT Q8 is coupled to the fixed voltage node 26. Moreover, a base of the eighth BJT Q8 is coupled to the first bias output 32 through a fifth resistor R5. The base of the eighth BJT Q8 is also coupled to the second bias output 34 through a sixth resistor R6.

During operation, while an RF signal applied to the differential input $RF_{IN}$ is in a first half cycle, the first BJT Q1 is off with a peak high collector voltage that causes an avalanche current to flow. The flow of avalanche current causes a base current of the first BJT Q1 to approach zero, leading the fifth BJT Q5 of the main bias circuitry 14 to bias towards off. As the fifth BJT Q5 approaches near off, output impedance at the first bias output 32 approaches an undesirably high level. However, the seventh BJT Q7 of the cross-coupled bias circuitry 16 is on due to bias current tapped from the second bias output 34, which draws an increased current flow through the fifth BJT Q5. Due to the increased current flow through the fifth BJT Q5, the output impedance of the first bias output 32 returns to a desirably lower level. This protective action provided by the cross-coupled bias circuitry 16 ensures that during a dangerously high collector voltage, the output impedance of the first bias output 32 as seen from the base of the first BJT Q1 of the power amplifier 12 is low enough to push breakdown voltage of the first BJT Q1 higher from $BV_{CEO}$ towards $BV_{CER}$, thereby protecting the power amplifier 12 from a catastrophic breakdown.

During operation, while the RF signal applied to the differential input $RF_{IN}$ is in a second half cycle, the second BJT Q2 is off with a peak high collector voltage that causes an avalanche current to flow. The flow of avalanche current causes a base current of the second BJT Q2 to approach zero, leading the sixth BJT Q6 of the main bias circuitry 14 to bias towards off. As the sixth BJT Q6 approaches near off, output impedance at the second bias output 34 approaches an undesirably high level. However, the eighth BJT Q8 of the cross-coupled bias circuitry 16 is on due to bias current tapped from the first bias output 32, which draws an increased current flow through the sixth BJT Q6. Due to the increased current flow through the sixth BJT Q6, the output impedance of the second bias output 34 returns to a desirably lower level. This protective action provided by the cross-coupled bias circuitry 16 ensures that during a dangerously high collector voltage, the output impedance of the second bias output 34 as seen from the base of the second BJT Q2 of the power amplifier 12 is low enough to push breakdown voltage of the second BJT Q2 higher from $BV_{CEO}$ towards $BV_{CER}$, thereby protecting the power amplifier 12 from a catastrophic breakdown.

Figure 3:
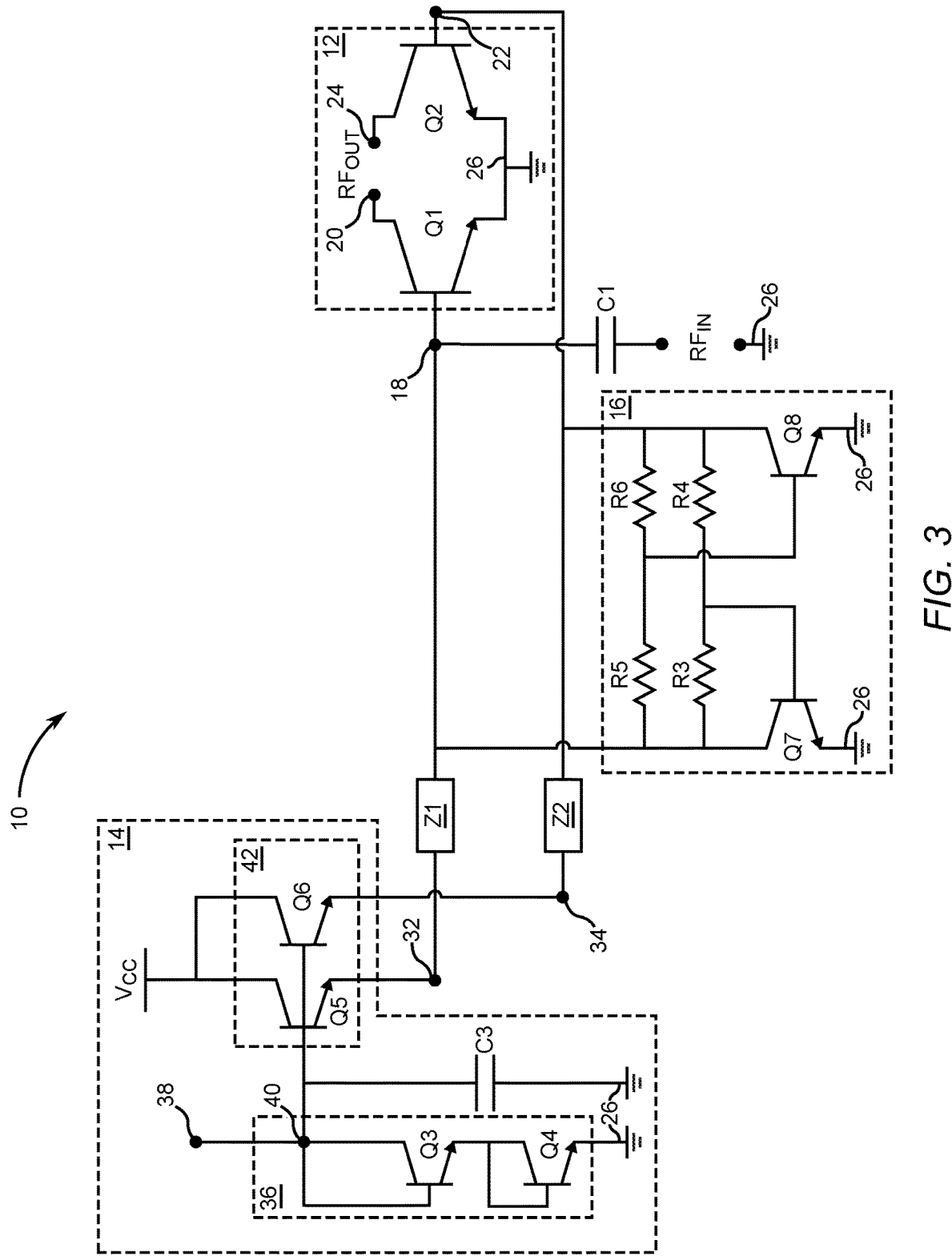
FIG. 3 is a schematic of a version of the exemplary embodiment of the power amplifier system of FIG. 2 that is modified to generate bias control signals directly from bases of the power amplifier.

FIG. 3 is a schematic of a modified version of the exemplary embodiment of the power amplifier system 10 of FIG. 2. In this modified version of the power amplifier system 10 depicted in FIG. 3, the collector of the seventh BJT Q7 is coupled directly to the first signal input 18. However, in contrast to the power amplifier system 10 of FIG. 2, the collector of the seventh BJT Q7, depicted in FIG. 3, is coupled to the first bias output 32 through the first impedance element Z1. Further still, in this modified version of the power amplifier system 10 depicted in FIG. 3, the collector of the eighth BJT Q8 is coupled directly to the second signal input 22, but in contrast to the power amplifier system 10 of FIG. 2, the collector of the eighth BJT Q8 is coupled to the second bias output 34 through the second impedance element Z2. Note that in this modified version of the exemplary embodiment of the power amplifier system 10, the emitter of the fifth BJT Q5 remains coupled to the first signal input 18 through the first impedance element Z1, and the emitter of the sixth BJT Q6 remains coupled to the second signal input 22 through the second impedance element Z2. The modified version of the power amplifier system 10 depicted in FIG. 3 is particularly useful in implementations having a distributed layout with a tree structure that make the cross-coupled bias circuitry 16 more difficult to control. Resistance values of and resistance ratios between the third resistor R3, fourth resistor R4, fifth resistor R5, and sixth resistor R6 are usable to control amplitude of a signal applied at the bases of the seventh BJT Q7 and eighth BJT Q8.

Figure 4:
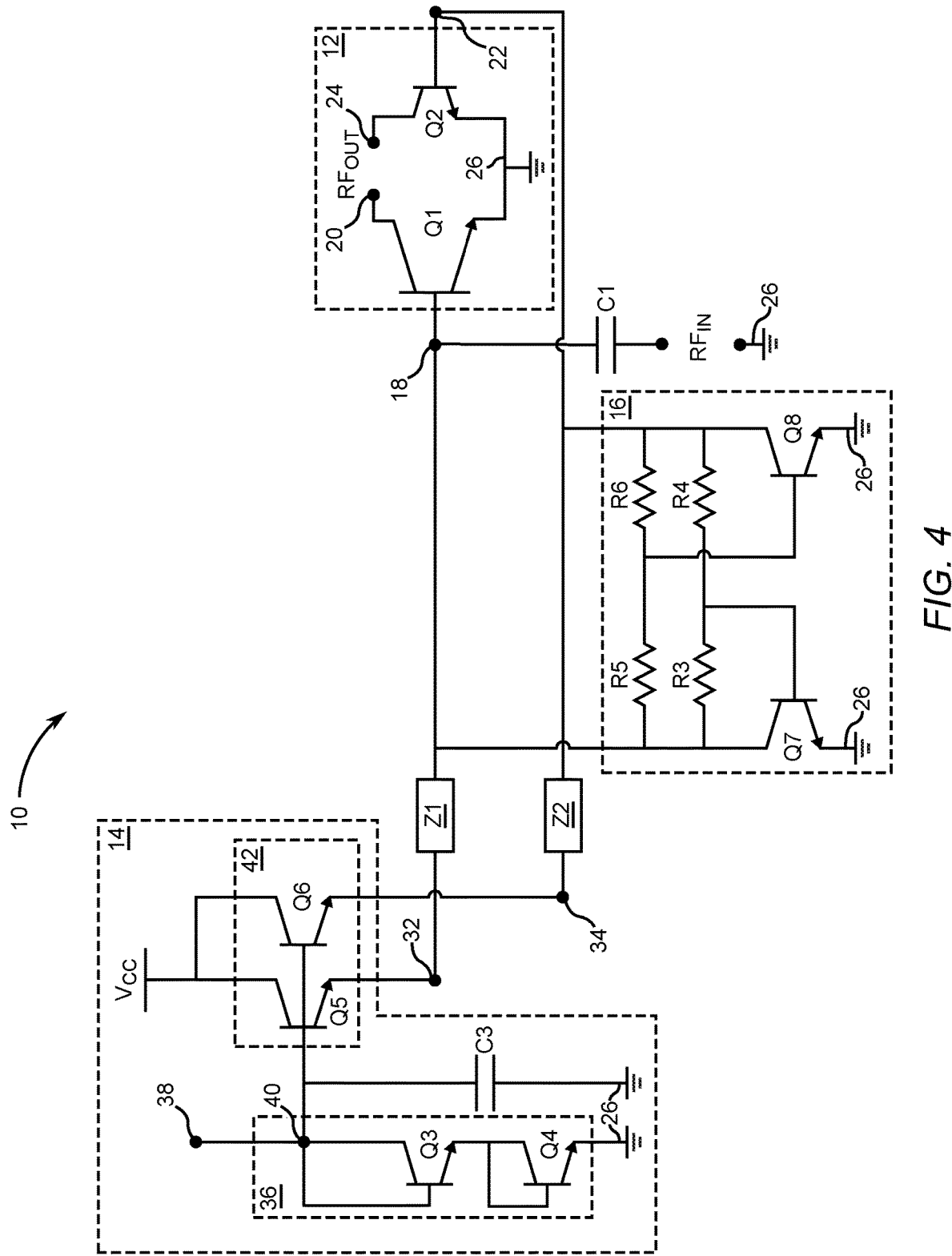
FIG. 4 is a schematic of a version of the exemplary embodiment of the power amplifier system of FIG. 3 in which the power amplifier is single-ended.

FIG. 4 is a schematic of a version of the exemplary embodiment of the power amplifier system 10 of FIG. 3 in which the power amplifier 12 is single-ended. In this embodiment, the first BJT Q1 and the second BJT Q2 are asymmetrical in size with the second BJT Q2 being relatively smaller than the first BJT Q1. In this case the second BJT Q2 is a scaled down replica of the first BJT Q1 and is included to develop a pseudo-differential bias control for the cross-coupled bias circuitry 16.

Further improvements to power amplifier systems such as power amplifier system 10 can be realized through the addition of an overvoltage protection loop (OVP). Traditionally, output voltage clamps consisting of several stacked bipolar diodes have been used at the output of power amplifiers, but the clamping threshold variation of output voltage clamps affects overall performance of an amplifier system. An active feedback OVP loop is much more desirable for maintaining a stable clamping level.

The present disclosure provides a power amplifier system that includes an active OVP loop that provides a temperature-compensated clipping threshold and a feedback loop to reduce the power amplifier bias point(s) when the clipping threshold is reached. The present active OVP loop can be applied to practically any bipolar stage, including silicon, SiGe, and GaAs technologies. The present active OVP loop was tested in conjunction with a 4G SiGe power amplifier powered under conditions of $V_{CC}$=6 V and VSWR=10:1 operation with no catastrophic failure while using high fT heterojunction bipolar transistors with lower breakdown voltages than lower fT heterojunction bipolar transistors.

Figure 5:
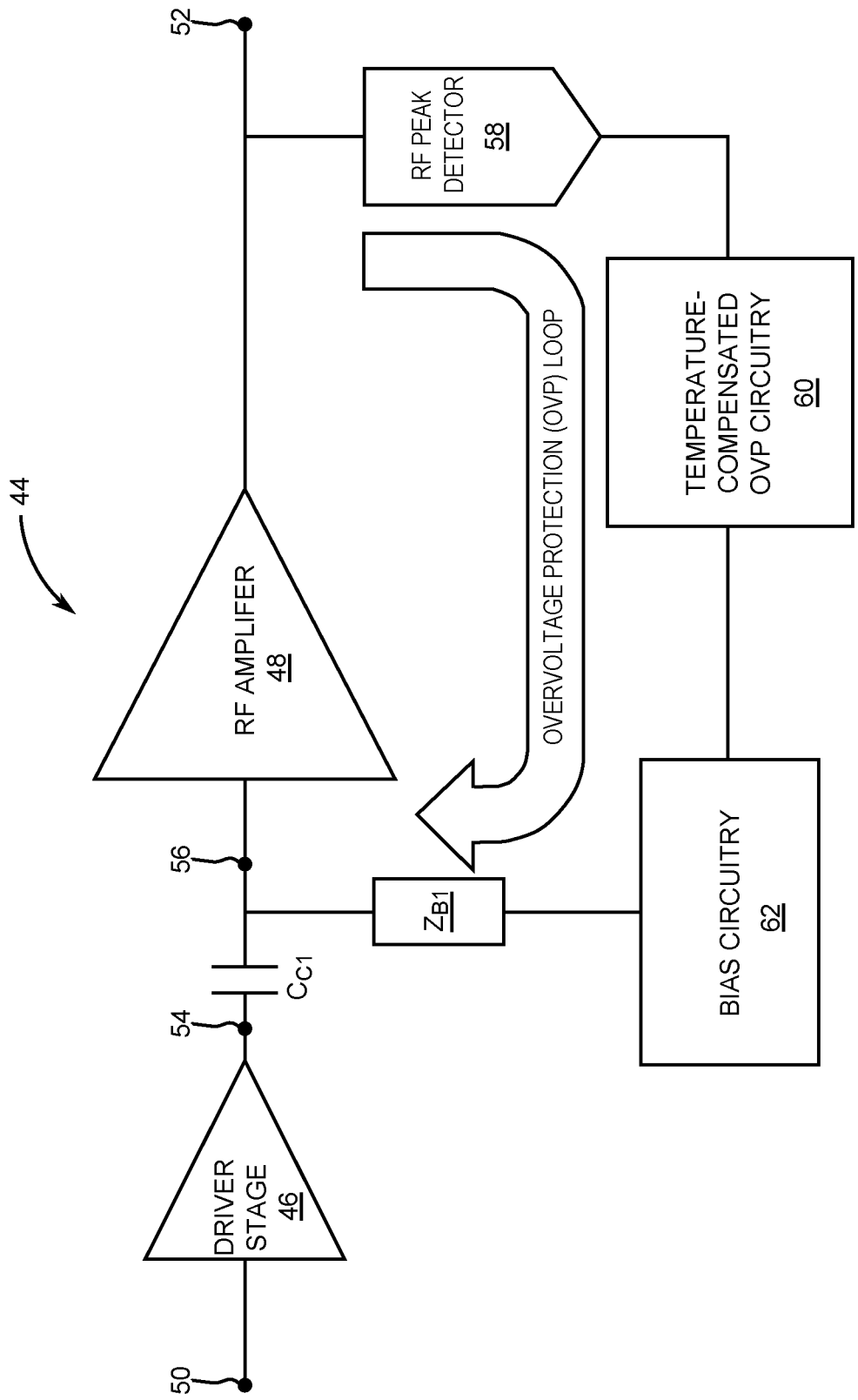
FIG. 5 is a diagram of an exemplary power amplifier system that incorporates an overvoltage protection loop that is temperature compensated in accordance with the present disclosure.

FIG. 5 is a diagram of an exemplary power amplifier system 44 that includes a driver stage 46 and a power amplifier 48 coupled in series between an RF input terminal 50 and an RF output terminal 52. A driver output terminal 54 of the driver stage 46 is coupled to an amplifier input terminal 56 of the power amplifier 48 through a coupling capacitor $C_{C1}$. An OVP loop to protect the power amplifier 48 from overvoltage conditions includes an RF peak detector 58, temperature-compensated OVP circuitry 60, and bias circuitry 62 that are coupled output to input in series between the RF output terminal 52 and the amplifier input terminal 56. In this exemplary embodiment, a bias signal generated by the bias circuitry 62 is coupled to the amplifier input terminal 56 through a bias impedance element $Z_{B1}$ that may be a resistor and/or an inductor. The bias circuitry 62 may be the cross-coupled bias circuitry 16 of FIGS. 3-4.

In operation, an RF signal applied to the RF input terminal 50 is amplified by the driver stage 46 and output to the amplifier input terminal 56 by way of the driver output terminal 54 and the coupling capacitor $C_{C1}$. An additionally amplified RF signal is then provided by way of the RF output terminal 52 as output to external circuitry such as an antenna (not shown). The RF peak detector 58 samples the additionally amplified RF signal and provides a peak voltage level to the temperature-compensated OVP circuitry 60. In turn, the temperature-compensated OVP circuitry 60 provides an OVP control signal to the bias circuitry 62 in response to the peak voltage level once a predetermined peak voltage threshold is exceeded. The bias circuitry 62 responds to the OVP control signal by adjusting the bias signal to reduce the gain of the power amplifier 48, thereby reducing the peak voltage at RF output terminal 52. The temperature-compensated OVP circuitry 60 is further configured to maintain the predetermined peak voltage threshold to within ±10% over an operational temperature range of between −40° C. and +85° C.

In some applications, the power amplifier 48 may have relatively lower voltage gain in comparison to relatively higher voltage gain provided by the driver stage 46. As such, the power amplifier 48 may not be responsive enough to the bias signal provided by the bias circuitry 62 to maximize overvoltage protection. In such applications, it may be advantageous to extend the OVP loop to an earlier stage such as the driver stage 46.

Figure 6:
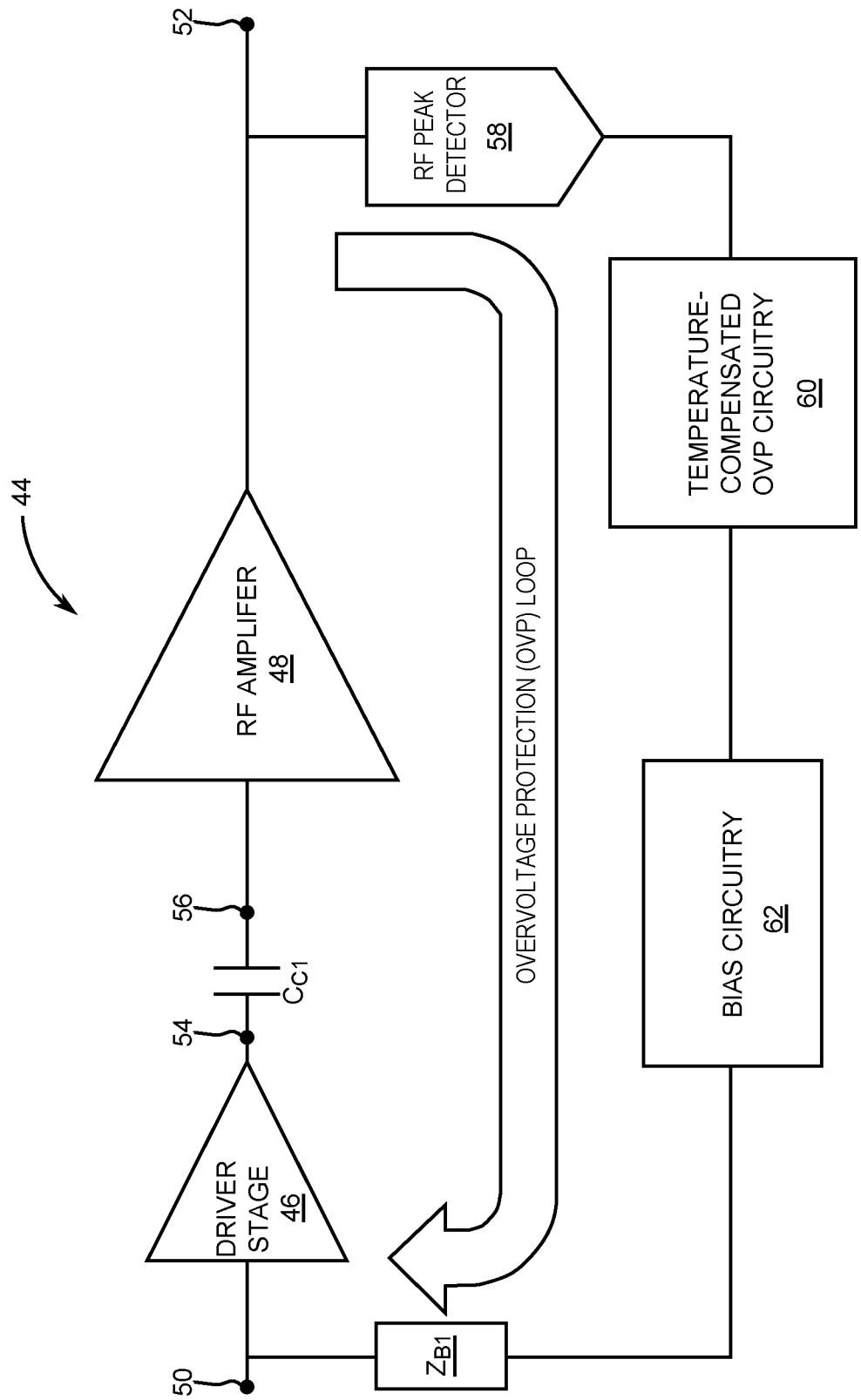
FIG. 6 depicts a modified version of the power amplifier system that in some applications provides a greater range of bias control than the embodiment of power amplifier system depicted in FIG. 5.

In this regard, FIG. 6 depicts a modified version of the power amplifier system 44 that in some applications provides a greater range of bias control than the embodiment of power amplifier system 44 depicted in FIG. 5. In this exemplary embodiment, the OVP feedback loop includes the driver stage 46. In particular, the bias circuitry 62 is coupled to the RF input terminal 50. In this exemplary embodiment, the bias circuitry 62 is coupled to the RF input terminal 50 through the bias impedance element $Z_{B1}$. However, it is to be understood that the bias signal provided by the bias circuitry 62 may be directly coupled to the RF input terminal 50 in some cases to provide stronger feedback.

Figure 7:
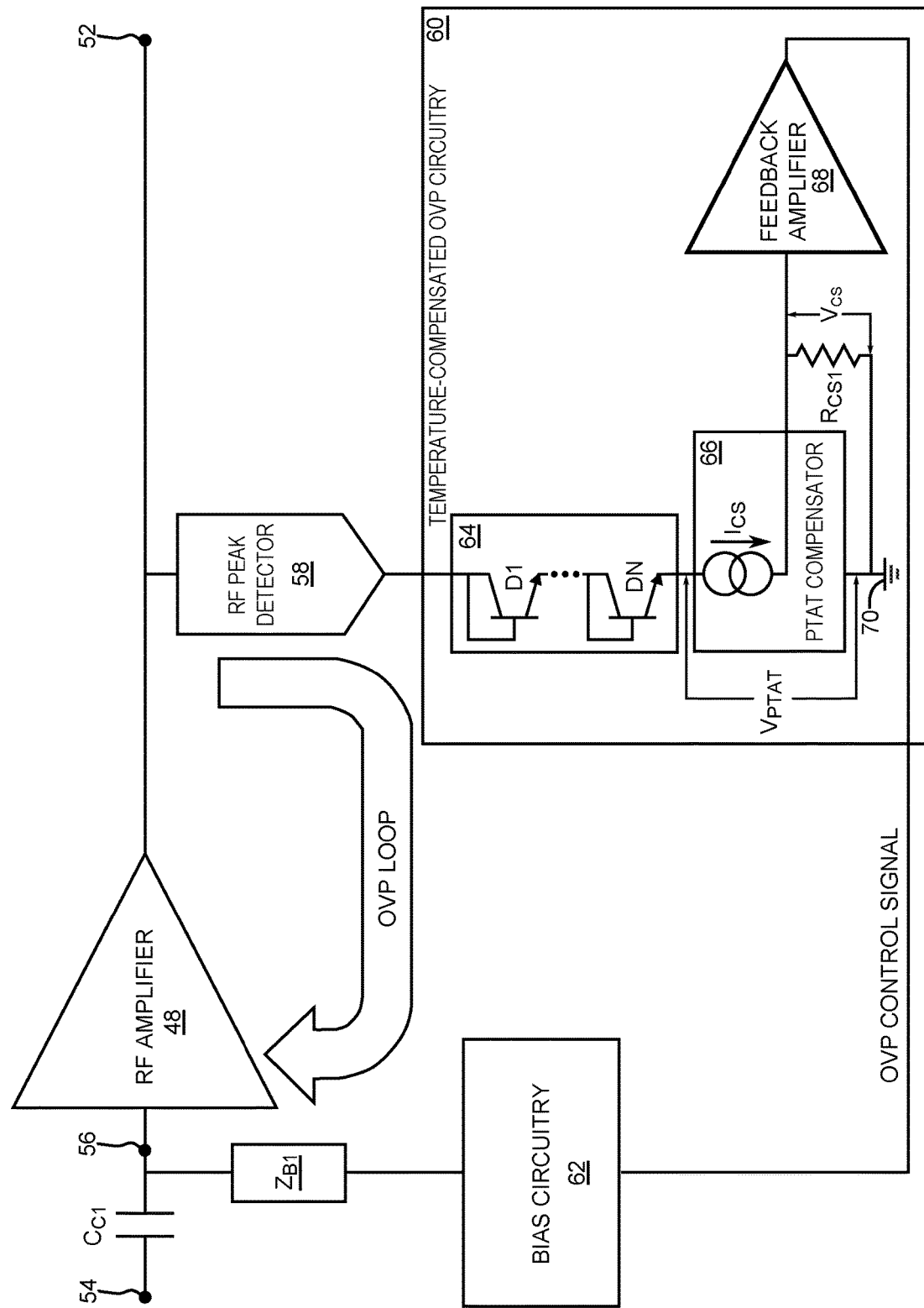
FIG. 7 is diagram of the exemplary power amplifier system of FIG. 5 depicting exemplary overvoltage protection (OVP) circuitry.

FIG. 7 is diagram of the exemplary power amplifier system 44 of FIG. 5 depicting an exemplary embodiment of the temperature-compensated OVP circuitry 60. In this exemplary embodiment, the temperature-compensated OVP circuitry 60 includes a voltage clamp 64, a proportional-to-absolute temperature (PTAT) compensator 66, and a feedback amplifier 68. The PTAT compensator 66 is depicted as a PTAT current source that outputs a current $I_{CS}$.

The voltage clamp 64 is coupled between an output of the RF peak detector 58 and an input of the PTAT compensator 66. The feedback amplifier 68 is coupled between an output of the PTAT compensator 66 and an input of the bias circuitry 62. A current sense resistor $R_{CS1}$ is coupled to an output of the PTAT compensator 66 and a fixed voltage node 70, such as ground. The current $I_{CS}$ flowing through the current sense resistor $R_{CS1}$ generates a current sense voltage $V_{CS}$ at an input of the feedback amplifier 68.

In this exemplary embodiment, the voltage clamp 64 is made up of an N number of diode-coupled BJTs, such as a first diode D1 and an Nth diode DN, where N is a natural counting number. The predetermined peak voltage threshold is equal to an N number of diodes making up the voltage clamp 64 times the base-to-emitter voltage ($V_{BE}$) of each diode plus a PTAT voltage drop $V_{PTAT}$ across the PTAT compensator 66. The N number of diodes inherently has a negative-to-absolute-temperature (NTAT) coefficient of approximately −2 mV/° K. The PTAT compensator 66 has a positive PTAT coefficient that is set to be approximately +2 mV/° K. Thus, a summation of the NTAT coefficient and the PTAT coefficient results in approximately 0 mV/° K change of the predetermined peak voltage threshold of the voltage clamp 64. As such, the embodiments of the power amplifier system 44 depicted in FIGS. 5 through 7 achieve stable and repeatable overvoltage protection over their full operating range of between −40° C. and +85° C.

Those skilled in the art will recognize improvements and modifications to the preferred embodiments of the present disclosure. All such improvements and modifications are considered within the scope of the concepts disclosed herein and the claims that follow.

What is claimed is:

1. A power amplifier system comprising:
   a power amplifier having a first signal input and a first signal output;
   main bias circuitry configured to provide a bias signal to the power amplifier through a bias output coupled to the first signal input; and
   cross-coupled bias circuitry comprising:
      a first transistor with a first collector coupled to the first signal input, a first base coupled to a second signal input of the power amplifier, and a first emitter coupled to a fixed voltage node; and
      a second transistor with a second collector coupled to the second signal input, a second base coupled to the first signal input, and a second emitter coupled to the fixed voltage node, wherein the bias circuitry is configured to reduce impedance at the first signal input in response to avalanche breakdown current generated by the power amplifier that increases impedance at the first signal input.

2. The power amplifier system of claim 1 wherein the fixed voltage node is ground.

3. The power amplifier system of claim 2 further including a first resistor coupled between the first base of the first transistor and the second signal input, and a second resistor coupled between the second base of the second transistor and the first signal input.

4. The power amplifier system of claim 3 further including a third resistor coupled between both the first base and the first collector of the first transistor, and a fourth resistor coupled between both the second base and the second collector of the second transistor.

5. The power amplifier system of claim 1 further including a first impedance element coupled between the first collector of the first transistor and the first signal input and a second impedance element coupled between the second collector of the second transistor and the second signal input.

6. The power amplifier system of claim 5 wherein the first impedance element and the second impedance element are both predominately resistive.

7. The power amplifier system of claim 5 wherein the first impedance element and the second impedance element are both predominately inductive.

8. The power amplifier system of claim 1 wherein the power amplifier is a differential amplifier having a third transistor with a third collector coupled to the first signal output, a third base coupled to the first signal input, and a third emitter coupled the fixed voltage node, and having a fourth transistor with a fourth collector coupled to an output terminal, and a fourth base coupled to the second signal input, and a fourth emitter coupled to the fixed voltage node, wherein the first signal input and the second signal input are configured to receive a differential RF signal to be amplified.

9. The power amplifier system of claim 8 wherein the third transistor and the fourth transistor are matching bipolar junction transistors.

10. The power amplifier system of claim 8 wherein the power amplifier is a single-ended amplifier having a third transistor with a third collector coupled to the first signal output, a third base coupled to the first signal input, and a third emitter coupled the fixed voltage node, and having a fourth transistor with a fourth collector coupled to the output terminal, and a fourth base coupled to the second signal input, and a fourth emitter coupled to the fixed voltage node, wherein the first signal input is configured to receive a single-ended RF signal to be amplified.

11. The power amplifier system of claim 10 wherein the third transistor and the fourth transistor are bipolar junction transistors.

12. The power amplifier system of claim 11 wherein the third transistor and the fourth transistor are asymmetrical in size.

13. The power amplifier system of claim 12 wherein the third transistor and the fourth transistor are both bipolar junction transistors.

14. The power amplifier system of claim 1 further comprising:
a radio frequency (RF) peak detector having an input coupled to the first signal output, wherein the RF peak detector is configured to generate a peak voltage signal; and
temperature-compensated overvoltage protection (OVP) circuitry coupled between an output of the RF peak detector and a control input of the bias circuitry, wherein the temperature-compensated OVP circuitry is configured to respond to the peak voltage signal exceeding a predetermined peak voltage threshold and provide an OVP control signal to cause the bias circuitry to adjust biasing for the power amplifier to reduce an overvoltage condition at the RF peak detector input, wherein the temperature-compensated OVP circuitry is further configured to maintain the predetermined peak voltage threshold to within ±10% over an operational temperature range of between −40° C. and +85° C.

15. The power amplifier system of claim 14 wherein the temperature-compensated OVP circuitry comprises:
a voltage clamp having a negative-to-absolute-temperature (NTAT) coefficient; and
a proportional-to-absolute temperature (PTAT) compensator having a PTAT coefficient scaled to cancel with the NTAT coefficient.

16. The power amplifier system of claim 15 wherein the voltage clamp comprises an N number of diode-coupled transistors, wherein N is a natural counting number.

17. The power amplifier system of claim 16 wherein the predetermined peak voltage threshold is equal to a summation of each base-to-emitter voltage of each of the N number of diode-coupled transistors plus a voltage drop across the PTAT compensator.

18. The power amplifier system of claim 17 further comprising:
a current sense resistor coupled between an output of the PTAT compensator and the fixed voltage node; and
a feedback amplifier coupled between the output of the PTAT compensator and the cross-coupled bias circuitry.

* * * * *